(12) United States Patent
Gergov et al.

(10) Patent No.: US 8,214,775 B2
(45) Date of Patent: Jul. 3, 2012

(54) SYSTEM FOR DETERMINING REPETITIVE WORK UNITS

(75) Inventors: Jordan Gergov, Santa Clara, CA (US); Allen Baisuck, Kona, HI (US)

(73) Assignee: Luminescent Technologies, Inc., Palo Alto, CA (US)

( * ) Notice: Subject to any disclaimer, the term of this patent is extended or adjusted under 35 U.S.C. 154(b) by 871 days.

(21) Appl. No.: 12/207,962

(22) Filed: Sep. 10, 2008

(65) Prior Publication Data

US 2009/0077527 A1 Mar. 19, 2009

Related U.S. Application Data

(60) Provisional application No. 60/972,683, filed on Sep. 14, 2007.

(51) Int. Cl.
G06F 17/50 (2006.01)
(52) U.S. Cl. ........................................................ 716/55
(58) Field of Classification Search ...................... 716/55
See application file for complete search history.

(56) References Cited

U.S. PATENT DOCUMENTS

| | | | |
|---|---|---|---|
| 5,440,720 A | 8/1995 | Baisuck et al. | |
| 5,559,718 A | 9/1996 | Baisuck et al. | |
| 5,812,415 A | 9/1998 | Baisuck | |
| 6,047,116 A * | 4/2000 | Murakami et al. | 716/54 |
| 6,225,025 B1 * | 5/2001 | Hoshino | 430/296 |
| 6,721,928 B2 | 4/2004 | Pierrat et al. | |
| 6,813,758 B2 | 11/2004 | Aleshin et al. | |
| 7,124,394 B1 | 10/2006 | Abrams et al. | |
| 7,178,127 B2 | 2/2007 | Abrams et al. | |
| 7,441,227 B2 | 10/2008 | Abrams et al. | |
| 7,480,889 B2 | 1/2009 | Abrams et al. | |
| 7,533,363 B2 | 5/2009 | Zhang et al. | |
| 7,571,423 B2 | 8/2009 | Abrams et al. | |
| 7,698,665 B2 | 4/2010 | Abrams et al. | |
| 7,703,068 B2 | 4/2010 | Abrams et al. | |
| 7,707,541 B2 | 4/2010 | Abrams et al. | |
| 7,757,201 B2 | 7/2010 | Abrams et al. | |
| 7,913,206 B1 | 3/2011 | Cadouri | |

(Continued)

OTHER PUBLICATIONS

Magoshi et al., "High-Speed Electron Beam Data Conversion System Combining Hierarchical Operation with Parallel Processing", Japanese Journal of Applied Physics, vol. 31, No. 12B, Part 1, Dec. 1992, pp. 4257-4261.*

(Continued)

*Primary Examiner* — Jack Chiang
*Assistant Examiner* — Brandon Bowers
(74) *Attorney, Agent, or Firm* — Wilson Sonsini Goodrich & Rosati

(57) ABSTRACT

During a method for generating a mask pattern for a photomask, a target pattern is partitioned into subsets of the target pattern. The subsets of the target pattern may be selected so that at least some of the subsets are approximately identical, thereby dividing the subsets into a degenerate group and a non-degenerate group. A group of the subsets may include multiple shapes, and a given target pattern may be significantly larger than a pre-determined length scale and a given shape in the multiple shapes is smaller than the pre-determined length scale. The non-degenerate group of subsets of the target pattern may be distributed to multiple processors. These processors may be used to determine subsets of the mask pattern based on the non-degenerate group of subsets of the target pattern. The subsets of the mask pattern may be combined to generate the mask pattern.

32 Claims, 11 Drawing Sheets

U.S. PATENT DOCUMENTS

| | | |
|---|---|---|
| 7,984,391 B2 | 7/2011 | Abrams et al. |
| 7,992,109 B2 | 8/2011 | Abrams et al. |
| 8,056,021 B2 | 11/2011 | Abrams et al. |

OTHER PUBLICATIONS http://www.siliconfareast.com/masks-reticles.htm, Dec. 2005.*

Camposano, Raul, CTO, GM, Sr. VP, slides, "Scaling Manufacturability Software to Thousands of Processors" Synopsys Jun. 15, 2006.

A.K. Wong, et al., "Massively Parallel Electromagnetic Simulation for Photolithographic Applications", IEEE Trans. on Computer-Aided Design of Integrated Circuits and Systems, vol. 14, No. 10, pp. 1231-1240, (Oct. 1995).

* cited by examiner

SYSTEM FOR DETERMINING REPETITIVE WORK UNITS

CROSS-REFERENCE

This application claims the benefit of U.S. Provisional Application No. 60/972,683, filed Sep. 14, 2007, which application is incorporated herein by reference.

BACKGROUND

1. Field of the Invention

The present invention relates to systems and techniques for determining write patterns for maskless-lithography processes that use write devices and mask patterns for photolithography processes that use photo-masks.

2. Related Art

Lithography processing represents an essential technology for manufacturing Integrated Circuits (IC) and Micro Electro-Mechanical Systems (MEMS). Lithographic techniques are used to define patterns, geometries, features, shapes, etc. onto an integrated-circuit die, semiconductor wafer, or chips, where the patterns are typically defined by a set of contours, lines, boundaries, edges, curves, etc., which generally surround, enclose, and/or define the boundary of the various regions which constitute the patterns.

One existing lithographic technique is photolithography, in which images defined by photo-masks are printed onto the integrated-circuit die or the semiconductor wafers. Furthermore, another existing lithographic technique is maskless lithography, in which a write device directly prints a write pattern onto the integrated-circuit die or the semiconductor wafers, thereby eliminating the need for photo-masks. Unfortunately, it is increasingly difficult to determine the write patterns, or to design and manufacture photo-masks.

In particular, demand for increased density of features on the integrated-circuit die and semiconductor wafers has resulted in the design of circuits with decreasing minimum dimensions. These trends have significantly increased the complexity of the computations necessary to determine the write patterns and/or the mask patterns (to which the photo-masks correspond), with a commensurate impact on computation time, processing requirements, and expense.

Furthermore, due to the wave nature of light, as dimensions approach sizes comparable to the wavelength of the light used in the photolithography processes, the resulting wafer patterns deviate from the corresponding photo-mask patterns and are accompanied by unwanted distortions and artifacts. Existing techniques (such as Optical Proximity Correction or OPC, and resolution enhancement technologies or RET) are used to pre-distort the mask patterns to improve resolution and/or a process window (i.e., a range of process conditions that result in acceptable yield) in a photolithography process. While these techniques may ensure that the wafer pattern is printed more accurately, determining the pre-distorted mask patterns is increasingly difficult, thereby exacerbating the computational complexity and the associated problems.

Hence, what is needed is a method and an apparatus that facilitates determination of write patterns and mask patterns without the above-described problems.

SUMMARY

One embodiment of the present invention provides a method for generating a mask pattern to be used on a photo-mask in a photolithographic process. During the method, a target pattern is partitioned into subsets of the target pattern. Note that the photo-mask is to print the target pattern during the photolithographic process. Furthermore, the subsets of the target pattern are selected so that at least some of the subsets are approximately identical, thereby dividing the subsets of the target pattern into a degenerate group of subsets of the target pattern and a non-degenerate group of subsets of the target pattern. In addition, at least a group of the subsets of the target patterns include multiple shapes, and a given target pattern in at least the group of subsets is significantly larger than a pre-determined length scale and a given shape in the multiple shapes is smaller than the predetermined length scale. Then, the non-degenerate group of subsets of the target pattern is distributed to multiple processors. These processors are used to determine subsets of the mask pattern based on the non-degenerate group of subsets of the target pattern. Moreover, a given subset of the mask pattern corresponds to a given subset of the target pattern. Next, the subsets of the mask pattern are combined to generate the mask pattern.

In some embodiments, the pre-determined length scale is a multiple of a wavelength of a source in the photo-lithographic process, and the multiple is between 1 and 10. For example, the pre-determined length scale may include one or more cell structures in the target pattern. Furthermore, in some embodiments the partitioning is independent of boundaries of cells having at least one of the cell structures. Thus, in some embodiments the partitioning is determined, at least in part, structures that are external to a given cell structure, such as connections to the given cell. These structures may include a cell-to-cell pitch in one or more directions.

In some embodiments, at least one of the subsets of the target pattern encompasses multiple cells having one or more of the cell structures or portions of multiple cells having one or more of the cell structures.

In some embodiments, the subsets of the target pattern are aligned with boundaries of cells having one or more of the cell structures. Furthermore, the alignment may be adaptively determined during the partitioning.

In some embodiments, the one or more cell structures include one or more bit cells in a memory block. Thus, in some embodiments the target pattern corresponds to memory.

In some embodiments, the partitioning is based on a size of the target pattern.

In some embodiments, the partitioning is based on a computation capability of the processors.

In some embodiments, the partitioning is iteratively repeated to increase the size of the degenerate group of subsets of the target pattern and to reduce the size of the non-degenerate group of subsets of the target pattern, thereby decreasing a computation time associated with generating the mask pattern. Moreover, in some embodiments the partitioning is based at least in part on a predicted degree of degeneracy.

In some embodiments, at least portions of adjacent subsets of the target pattern partially overlap each other. For example, the overlap may be less than a pre-determined multiple of the wavelength of the source in the photolithographic process.

In some embodiments, at least some of the processors determine subsets of the mask pattern concurrently. However, in some embodiments at least some of the processors determine subsets of the mask pattern at different times.

In some embodiments, a first format of a target pattern is converted into a second format prior to the partitioning. Note that the first format may include a hierarchical representation of the target pattern and the second format may include a pixel-based representation. For example, the first format may be compatible with GDSII and/or OASIS.

In some embodiments, the method involves verifying the mask pattern, where the verifying involves comparing an estimated wafer pattern produced in the photolithographic process using a photo-mask corresponding to the mask pattern with the target pattern. Moreover, the verifying may involve partitioning the mask pattern into subsets of the mask pattern, where the subsets of the mask pattern are selected so that at least some of the subsets are approximately identical, thereby dividing the subsets of the mask pattern into a degenerate group of subsets of the mask pattern and a non-degenerate group of subsets of the mask pattern.

Another embodiment provides a computer system configured to execute instructions corresponding to at least some of the above-described operations.

Another embodiment provides a computer-program product for use in conjunction with the computer system.

Another embodiment provides a semiconductor wafer. This semiconductor wafer is produced in the photolithography process that uses the photo-mask.

Another embodiment provides the photo-mask.

Another embodiment provides a data file stored in a computer-readable memory that includes information corresponding to the mask pattern.

Another embodiment provides a method for generating a write pattern to be used in a maskless-lithographic process. During the method, the target pattern is partitioned into the subsets of the target pattern. Note that the write pattern is to be used to print the target pattern during the maskless-lithographic process. Furthermore, the subsets of the target pattern are selected so that at least some of the subsets are approximately identical, thereby dividing the subsets of the target pattern into a degenerate group of subsets of the target pattern and a non-degenerate group of subsets of the target pattern. In addition, at least a group of the subsets of the target patterns include multiple shapes, and a given target pattern in at least the group of subsets is significantly larger than a pre-determined length scale and a given shape in the multiple shapes is smaller than the predetermined length scale. Then, the non-degenerate group of subsets of the target pattern is distributed to multiple processors. These processors are used to determine subsets of the write pattern based on the non-degenerate group of subsets of the target pattern. Moreover, a given subset of the write pattern corresponds to a given subset of the target pattern. Next, the subsets of the mask pattern are combined to generate the write pattern.

Another embodiment provides a data file stored in a computer-readable memory that includes information corresponding to the write pattern.

Another embodiment provides a method for partitioning a target pattern to be used in generating a mask pattern to be used on a photo-mask in a photolithographic process. During the method, the target pattern is partitioned into subsets of the target pattern, where the photo-mask is to be used to print the target pattern during the photolithographic process. Note that at least a group of the subsets of the target patterns include multiple shapes, and a given target pattern in at least the group of subsets is significantly larger than a pre-determined length scale and a given shape in the multiple shapes is smaller than the pre-determined length scale. Then, a degenerate group of subsets of the target pattern and a non-degenerate group of subsets of the target pattern are determined.

Another embodiment provides a method for partitioning a target pattern to be used in generating a write pattern to be used in a mask-less lithographic process. During the method, the target pattern is partitioned into subsets of the target pattern, where the write pattern is to be used to print the target pattern during the mask-less lithographic process. Note that at least a group of the subsets of the target patterns include multiple shapes, and a given target pattern in at least the group of subsets is significantly larger than a pre-determined length scale and a given shape in the multiple shapes is smaller than the pre-determined length scale. Then, a degenerate group of subsets of the target pattern and a non-degenerate group of subsets of the target pattern are determined.

Incorporation by Reference

All publications, patents, and patent applications mentioned in this specification are herein incorporated by reference to the same extent as if each individual publication, patent, or patent application was specifically and individually indicated to be incorporated by reference.

Figure 1:
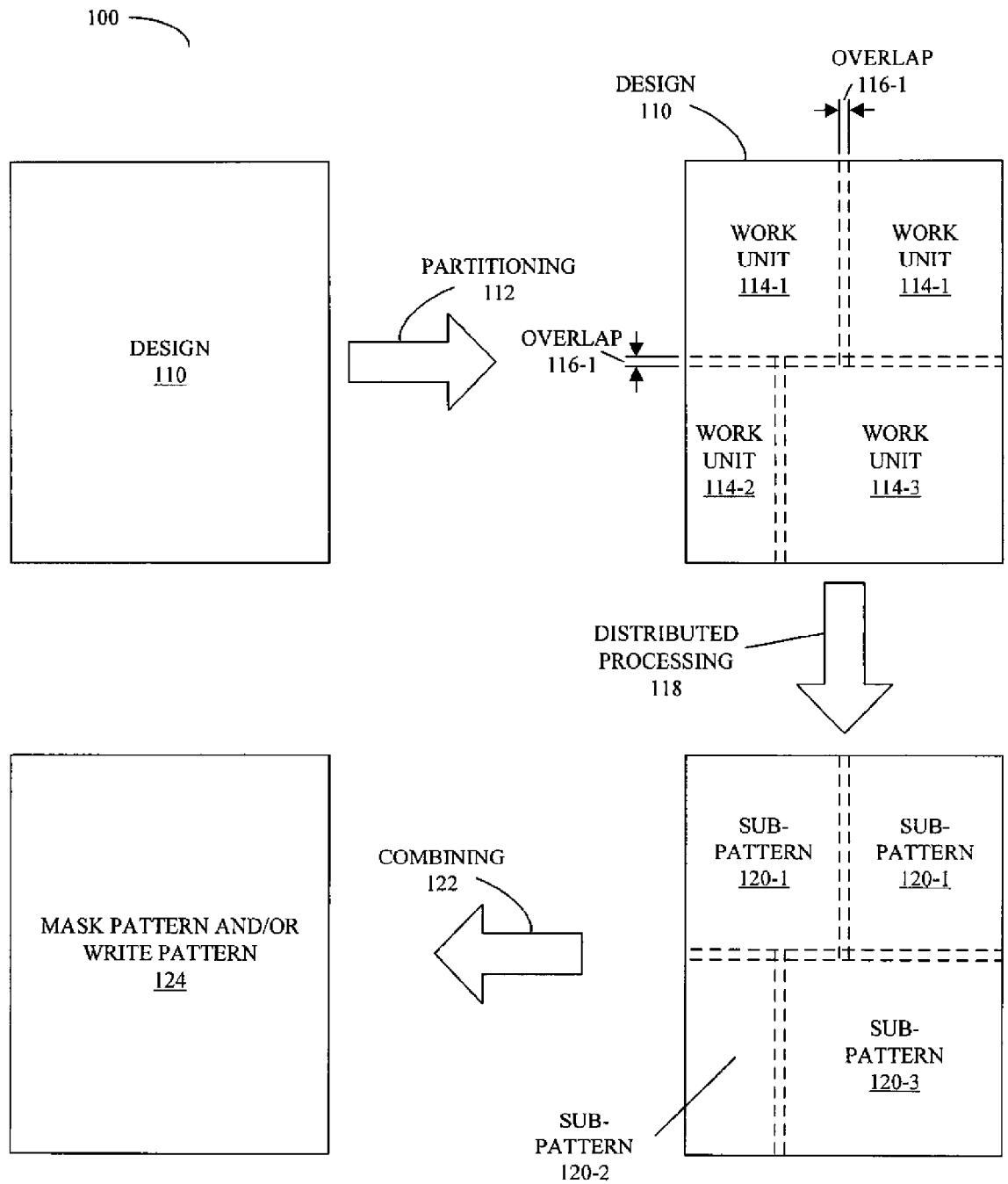
FIG. 1 is a block diagram illustrating a technique to generate a mask pattern and/or a write pattern in accordance with an embodiment of the present invention.

Table 1 provides a summary of results of partitioning of a target pattern using an aligned partitioning technique in accordance with an embodiment of the present invention.

Table 2 provides a summary of results of partitioning of a target pattern using a hybrid partitioning technique in accordance with an embodiment of the present invention.

Table 3 provides a summary of results of partitioning of target patterns in accordance with an embodiment of the present invention.

Note that like reference numerals refer to corresponding parts throughout the drawings.

DETAILED DESCRIPTION

The following description is presented to enable any person skilled in the art to make and use the invention, and is provided in the context of a particular application and its requirements. Various modifications to the disclosed embodiments will be readily apparent to those skilled in the art, and the general principles defined herein may be applied to other embodiments and applications without departing from the spirit and scope of the present invention. Thus, the present invention is not intended to be limited to the embodiments shown, but is to be accorded the widest scope consistent with the principles and features disclosed herein.

Embodiments of a computer system, a method, a computer program product (i.e., software), and a data structure or a file for use with the computer system are described. These systems, processes, and/or data structures may be used to determine or generate mask patterns that are used to produce photo-masks, which in turn are used to produce integrated-circuit die and/or semiconductor wafers (henceforth referred to as semiconductor wafers) during a photolithographic process. Furthermore, in some embodiments the systems, processes, and/or data structures are used to determine or generate write patterns that are used to produce the semiconductor wafers during a maskless-lithographic process (such as a process that uses a direct write device). In particular, the photo-mask may be used to print a target pattern corresponding to a design (such as a design layer in an integrated circuit) on to a semiconductor wafer. Alternatively, a write device (such as a laser writer or an e-beam writer) may use the write pattern to write the target pattern on to the semiconductor wafer.

In some embodiments, the target pattern is divided or partitioned into subsets of the target pattern (which are also referred to as work units). These work units may be selected so that at least some of the work units are approximately identical, congruent (i.e., having the same size or shape), and/or repetitive. For example, work units that are approximately identical may include the same or similar structures (such as cell structures), and more generally, the partitioning is based on a context in the target pattern (such as cell structures, cell boundaries, cell sizes, cell types, cell features, and/or features proximate but external to cells, such as connections to cells and/or a cell pitch in one or more directions). In an example embodiment, the context has a length scale equal to 4 times a wavelength of a source used in a photolithographic process. Furthermore, at least a group of the subsets of the target patterns include multiple shapes (such as trapezoids), and a given target pattern in at least the group of subsets is significantly larger than the context and a given shape in the multiple shapes is smaller than the context. Note that the length scale of the context is the natural granularity of the shapes in a given circuit design.

Thus, in some embodiments the same or similar structures in work units that are approximately identical may map to one another when one or more operations or transformations are applied to the work units. These operations or transformations may include similarity transforms and/or conformal-mapping operations, such as scaling, rotation, reflection, and/or translations of the structures within the work units.

Note that adjacent work units may at least partially overlap. For example, the overlap may be less than a pre-determined multiple of the wavelength of the source in the photolithographic process, such as a multiple between 1 and 10. In the discussion that follows, these overlapping regions are sometimes referred to as halos.

By defining the work units in this way, the work units are divided into two groups, a degenerate group of work units and a non-degenerate group of work units. In some embodiments, the partitioning may be repeated (for example, adaptively or iteratively) to increase the size of the degenerate group, and thus, to decrease the size of the non-degenerate group.

Then, the non-degenerate group of work units may be distributed to multiple processors and/or to multiple processor cores. Operating concurrently and/or independently (i.e., at different times), these processors and/or processor cores are used to determine subsets of the mask pattern and/or the write pattern. Note that a given subset of the mask pattern and/or a given subset of the write pattern corresponds to a given subset of the target pattern. Next, the subsets of the mask pattern are combined to generate the mask pattern, or the subsets of the write pattern are combined to generate the write pattern.

In some embodiments, a format of the target pattern is converted prior to the partitioning. For example, the target pattern may be converted from a hierarchical representation (such as GDSII and/or OASIS) to a pixel-based representation or a format having fewer levels than the original format. Note that this conversion process may reduce or eliminate dependencies between the work units. Similarly, after the write pattern and/or the mask pattern is generated, a format of either or both of the write pattern or the mask pattern may be converted back to the original format.

Thus, this approach to generating the mask pattern and/or the write pattern facilitates parallel processing of the work units while decreasing the associated computation time by reducing the number of work units that need to be processed (i.e., by extracting repetition and thereby decreasing the size of the non-degenerate group of work units). In addition, since the work units that are determined during the partitioning are largely self-contained, i.e., approximately or completely independent of each other, this approach scales as the number of processors is increased (indeed, scalability is limited only by the number of available processors). For example, events as power failures or compute-node hardware failures during a set of runs do not require a 'complete rerun' to generate a mask pattern and/or a write pattern, and the processing of particular work units may be more aggressive from the point of view of mask pattern and/or write pattern features (such as the use of tighter tolerances). Moreover, this approach is also able to accommodate complicated design hierarchies, and execution or run times do not increase exponentially as feature sizes in the designs are reduced.

We now describe embodiments of a system and a technique for determining repetitive work units. FIG. 1 presents a block diagram illustrating a technique 100 to generate a mask pattern and/or a write pattern in accordance with an embodiment of the present invention. In this technique, a target pattern or a design 110 (such as a layer in an integrated circuit) is partitioned 112 into a set of work units 114. Each of the work units (such as work unit 114-1) corresponds to a subset of the design 110. Furthermore, adjacent work units have overlap 116 with each other. And in some embodiments, shapes and/or structures in the design 110 that are located 'above' a given work unit (such as the work unit 114-1) are placed directly in the work unit. For example, a deep-design cell structure may have vertical overlap, such as shapes or structures in one cell instance that are located above the shapes or structures in another cell instance.

Note that the overlap 116 (which is also referred to as a halo) may make it easier to combine sub-patterns 120 of the write pattern and/or the mask patterns that are generated from the work units 114. The halo also ensures that all data configurations in the design 110 are handled during the technique 100 (i.e., that none of the design 110 is missed) and that interactions between the work units 114 are addressed. Furthermore, the halo may be a multiple of a wavelength of a source (such as a wavelength corresponding to a fundamental component of a light source or an electron source) in a lithographic process. In an example embodiment, the halo is 3-5 times this wavelength. For example, the wavelength may be 193 nm and the overlap 116 may be 800 nm. In some embodiments, the source includes one or more lamps (including I line, g line, a wavelength of 193 nm, a wavelength of 248 nm, immersion, and/or any other optical lithography wavelength in air, water, or another fluid or gas), a laser, and/or an electron-beam source. Moreover, the source may be configured to provide off-axis illumination, dipole illumination, quadrupole illumination, quasar illumination, incoherent illumination, coherent illumination, and/or any arbitrary illumination pattern.

In some embodiments, the partitioning 112 is based, at least in part, on a degree of alignment of adjacent or proximate patterns. For example, if a central coordinate for each pattern is $(X_i, Y_j)$, the alignment may be determined as the ratio of the number of patterns divided by the product of the different $(X_i, Y_j)$. Thus, the alignment may be bounded between 0 and 1, where adjacent or overlapping patterns have larger values of the alignment and larger values of the alignment are indicative of a better partition.

After the partitioning 112, non-redundant work units (i.e., work units that are different from each other) are distributed for processing 118 to determine sub-patterns 120 (i.e., the sub-patterns of the write pattern and/or the mask pattern). For example, these work units may be distributed to a group of processors and/or processor cores. Note that such a system may be distributed over multiple computers or servers, and may also be dispersed over multiple locations. In addition, computations may be implemented in computers or servers that are coupled via a network (such as the Internet and/or an intranet). As noted above, the sub-patterns 120 are then combined 122 to generate a mask pattern and/or a write pattern 124.

To facilitate faster and less expensive determination of the mask pattern and/or the write pattern 124, the partitioning 112 in the technique 100 may be configured to reduce and/or minimize the number of work units that are geometrically different (i.e., to reduce and/or minimize the size of the non-degenerate group of work units). Furthermore, the size of the work units 114 may be selected based on the computational capability of and/or the number of available processor and/or processor cores that are to be used in the distributed processing 118.

In some embodiments, the partitioning 112 is based on a context in the target pattern or design 110, such as cell structures, cell boundaries, cell sizes, cell types, and/or cell features. Note that a cell may include a standard cell, a gate array, a functional block, a logic block, and/or a macro cell. In an example embodiment, the cell structures include polygons (such as trapezoids). In another example embodiment, the target pattern or design 110 is a memory, and the cell structures include one or more bit cells in a memory block. Using such a feature as the basis structure for the work units 114 may result in significant repetition, i.e., in a small size of the non-degenerate group of work units.

Note that partitioning 112 may also be based, at least in part, on the size of the target pattern or design 110 and/or size constraints on the work units 114. For example, in some embodiments at least some of the work units 114 may have areas greater than 10000 $nm^2$ and/or less than 100 or 1000 $\mu m^2$. In an example embodiment, the maximum size of the work units 114 is 36 or 144 $\mu m^2$.

In some embodiments, the partitioning 112 is independent of boundaries of cells having at least one of the cell structures. Thus, at least one of the work units 114 may encompass portions of one or more cells having one or more cell structures. However, in some embodiments at least one of the work units 114 is aligned with boundaries of one or more cells having one or more of the cell structures. And in some embodiments, at least one of the work units 114 includes multiple cells having one or more of the cell structures.

Thus, the basic idea underlying the partitioning 112 is to leverage repetition or redundancy in the design 110. While a given design may include hundreds or thousands of cells, each of these cells may be utilized many times such that the total number of cell instances is in the millions or billions. Excluding the environmental or local considerations of each of these instances (such as protruding shapes from adjacent cells or sibling instances), ideally only one instance of a given cell is processed, i.e., the corresponding sub-pattern may be determined, and this sub-pattern may be applied to all of the instances of this cell. In practice, this degree of reduction in the number of non-degenerate work units may be difficult to achieve. Nonetheless, significant reductions in the number of calculations, and thus, the total computation time may be achieved using the technique 100.

To facilitate high scalability of the technique 100 to multiple processor and/or processor cores, in some embodiments the design 110 is decomposed (i.e., partitioned 112) such that the work units 114 are independent of each other. In this way, there will not be interdependencies between the computations that are implemented on different processors and/or processor cores. One approach to achieving this independence is to convert the target pattern or design 110 from a first or initial format into a second format. For example, the initial format may be hierarchical, such as one compatible with GDSII, OASIS, and/or another polygon-type format. The second format may be a hierarchy with two levels, a top level and everything else. In such a hierarchy, the processing of a cell instance does not depend on the processing of any other cell instance. Thus, in theory all of the instances may be processed in parallel. Note that in some embodiments the initial format and/or the second format may include a pixel-based format (i.e., spatially discrete) data patterns (such as bitmap and/or grayscale images), binary patterns, and/or a continuous-tone patterns.

In some embodiments, during this transformation from the initial, hierarchical format to the 2-level hierarchal format, the intrinsic hierarchical structure of the design 110 is leveraged by performing operations including: breaking large cells into smaller pieces such that pieces of a single cell instance may be executed in parallel; expanding single usage cells such that their boundaries do not hamper the computations; and combining cells that occur a large number of times in the same combination (or pairing) and with the same relative orientation. Furthermore, these operations may be applied while keeping track of the repetitive nature of the cell instances (i.e., the size of the non-degenerate group of work units). Note that in the 2-level hierarchy, each of these instances may correspond to one of the work units 114. Also note that some or all of the work units 114 may not have the same size. Typically, the size of the work unit 114 depends on the specific area of the design 110 that is being represented.

Through careful bookkeeping (i.e., by storing and comparing the work units 114), instances that are approximately the same (including their local environments) are identified. For example, repetition may occur in the initial format or hierarchy or there may be cell instances that are geometrically congruent. Then, only one or these instances or work units 114 is processed as a proxy for the other work units 114, and the result of this processing (a sub-pattern) is suitably reproduced in the resulting mask pattern and/or write pattern.

Note that a metric for the amount of repetition leverage during the partitioning 112 may be determined by calculating the sum of the areas of the work units 114 that are to be processed, and dividing this sum by the total area of the design 110. In the discussion below, the reciprocal of this portion of the area of the design 110 that is to be processed is referred to as the repetition factor. It is a metric for the reduction in the total computation time. Typically, this repetition factor allows the total run time to be estimated (in advance) with an accuracy of approximately ±10%.

Furthermore, scalability of the technique 100 is determined (at least in part) by the intrinsic hierarchy in the design 110, and in particular, based on the actual repetition when the design 110 is 'flattened' into a 2-level hierarchy. The independence of the work units 114 in this hierarchy allows the processing 118 to occur independently (i.e., at different times) and/or concurrently (i.e., at least some of the work units 114 may be processed at the same time). Therefore, technique 100 has the advantages of a simple, flat approach to the processing 118 along with repetition leverage.

Note that in some embodiments technique 100 may include fewer or additional operations or components, two or more operations or components may be combined into a single component, and/or a position of one or more operations or components may be changed.

Figure 2:
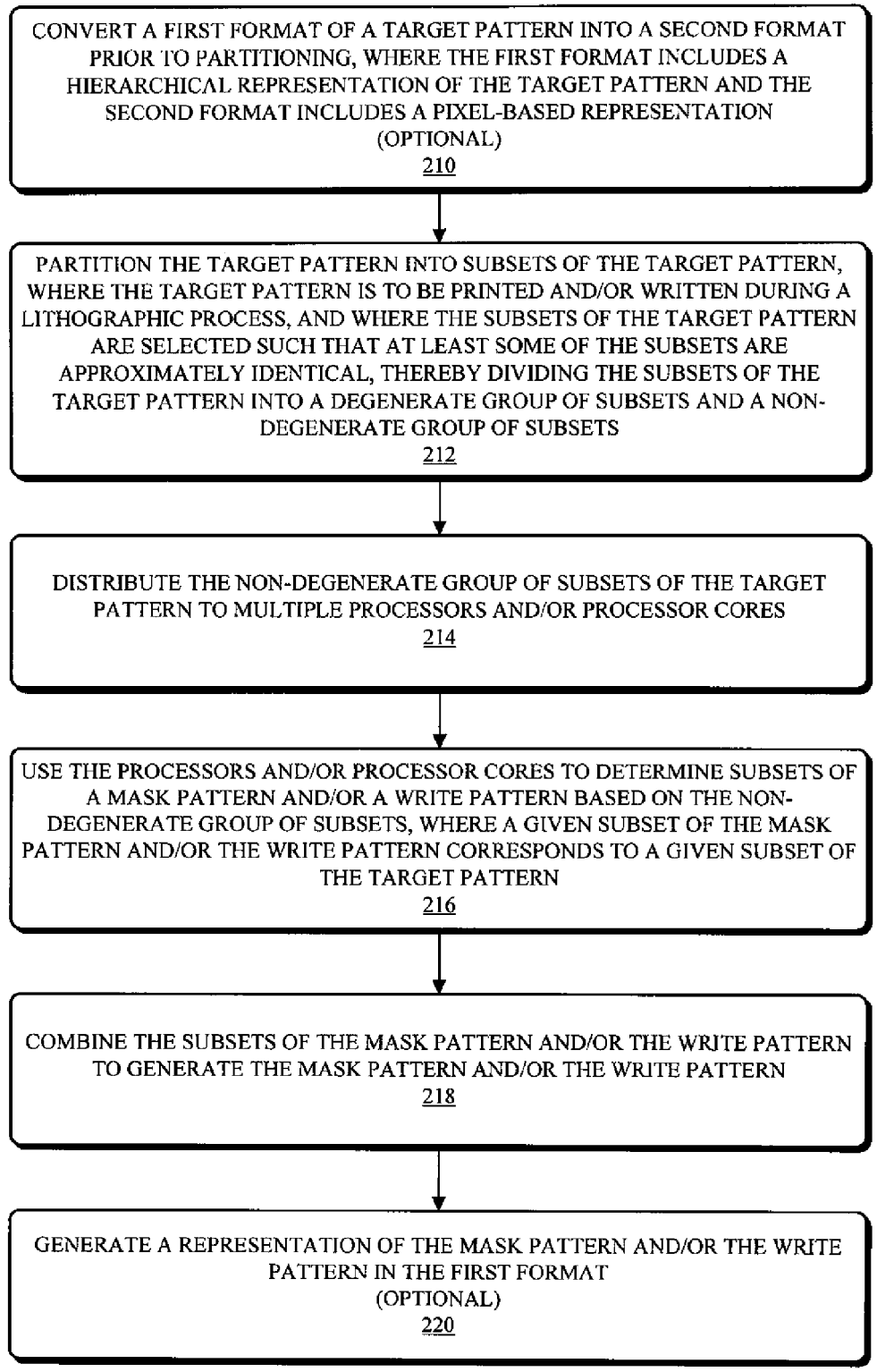
FIG. 2 is a flow chart illustrating a process to generate a mask pattern and/or a write pattern in accordance with an embodiment of the present invention.

We now describe embodiments of processes for generating write patterns and/or mask patterns. FIG. 2 presents a flow chart illustrating a process 200 to generate a mask pattern and/or a write pattern in accordance with an embodiment of the present invention. During this process, a computer system optionally converts a first format of a target pattern into a second format prior to partitioning (210). Note that the first format may include a hierarchical representation of the target pattern and the second format may include a pixel-based representation. The computer system partitions the target pattern into subsets of the target pattern (212). This target pattern is to be printed and/or written during a lithographic process. Furthermore, the subsets of the target pattern are selected such that at least some of the subsets are approximately identical, thereby dividing the subsets of the target pattern into a degenerate group of subsets and a non-degenerate group of subsets. In addition, at least a group of the subsets of the target patterns include multiple shapes, and a given target pattern in at least the group of subsets is significantly larger than a pre-determined length scale and a given shape in the multiple shapes is smaller than the pre-determined length scale.

Then, the computer system distributes the non-degenerate group of subsets of the target pattern to multiple processors and/or processor cores (214). Furthermore, the computer system uses the processors and/or processor cores to determine subsets of a mask pattern and/or a write pattern based on the non-degenerate group of subsets (216). Note that a given subset of the mask pattern and/or the write pattern corresponds to a given subset of the target pattern.

Next, the computer system combines the subsets of the mask pattern and/or the write pattern to generate the mask pattern and/or the write pattern (218). In some embodiments, the computer system optionally generates a representation of the mask pattern and/or the write pattern in the first format (220). This operation may allow any errors that occur in the mask pattern and/or the write pattern to be mapped back into the original hierarchy of the target pattern, thereby facilitating validation of the mask pattern and/or the write pattern.

Figure 3:
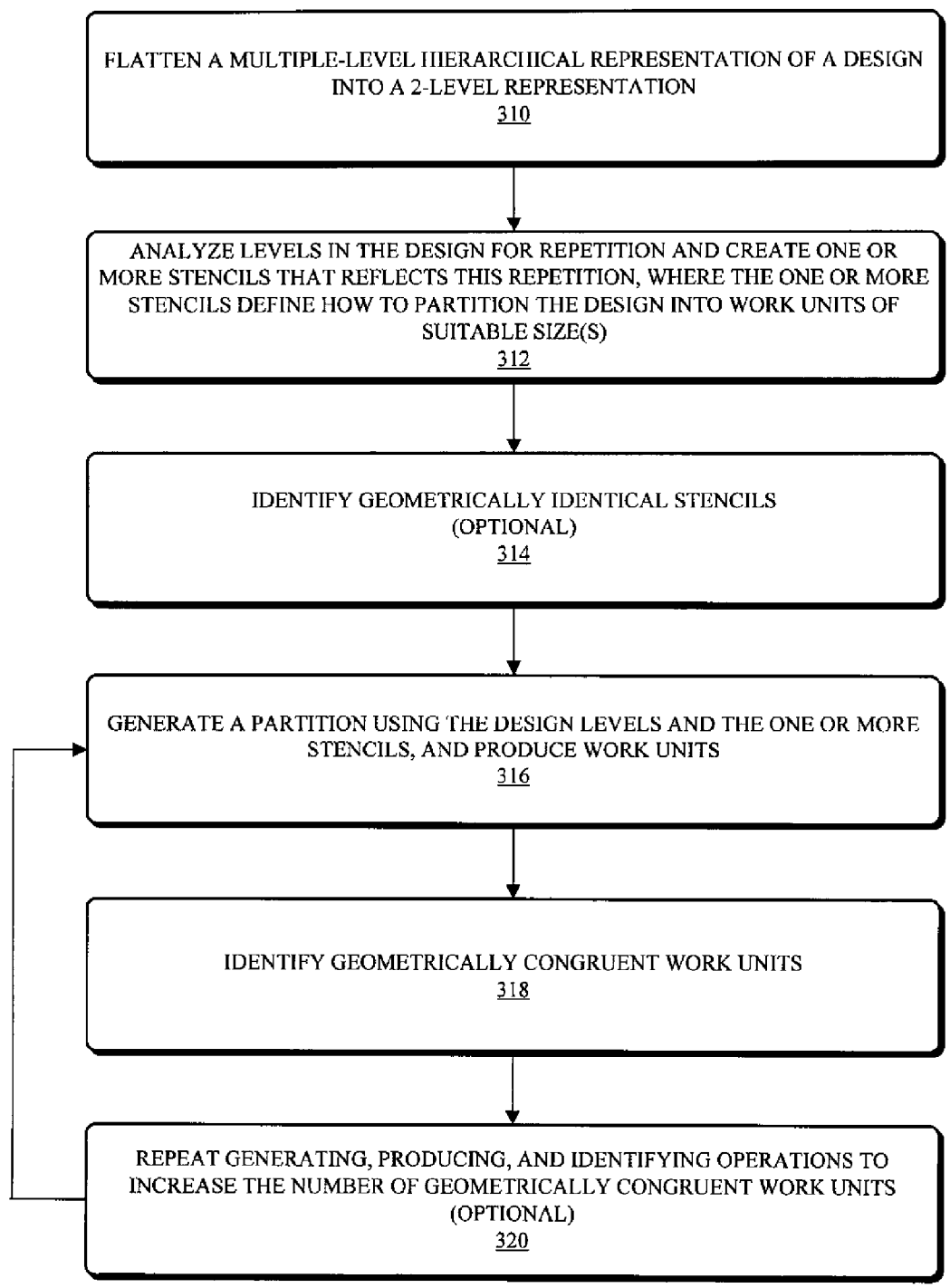
FIG. 3 is a flow chart illustrating a process for generating a mask pattern and/or a write pattern in accordance with an embodiment of the present invention.

FIG. 3 presents a flow chart illustrating a process 300 for generating a mask pattern and/or a write pattern in accordance with an embodiment of the present invention. In particular, process 300 illustrates an embodiment of the partitioning operation 212 (FIG. 2) in the process 200 (FIG. 2). During this process, a computer system flattens a multiple-level hierarchical representation of a design into a 2-level representation (310). Then, the computer system analyzes the design for repetition and creates one or more stencils that reflect this repetition (312). For example, the computer system may analyze a few of the design layers for repetition and create a stencil that reflects the expected repetition. Note that the one or more stencils define how to partition the design into work units of suitable size(s). In particular, given a polygon, such as a rectangle, a stencil exactly specifies how to decompose the rectangle into a collection of mutually exclusive and collectively exhaustive smaller rectangles. Furthermore, in some embodiments the computer system optionally identifies geometrically identical stencils (314).

Note that a stencil may be defined using the design area without knowledge of the design cells and the geometries within these cells. However, a stencil may be derived from a design using detailed knowledge of its repetition structure including cells and geometric shapes. In contrast, a partition is a geometrically optimized representation of a few design layers that is different from a stencil. (although given a few design layers, there is a one-to-one mapping between stencils and partitions). As discussed further below with reference to FIG. 4B, a stencil may be represented as a collection of rectangles that may satisfy mutually-exclusive-and-collectively-exhaustive constraints. Furthermore, a persistent representation of a stencil may be based on an optimized ASCII format, while a C++ representation of a stencil in a certain region is a query data structure.

Next, the computer system generates a partition using the design levels and the one or more stencils, and produces work units (316). The computer system also identifies geometrically congruent work units (318). For example, using a few design layers as an input, work units may be output based on a stencil, and any pair of geometrically congruent work units may be identified. Note that the output is a partition that represents the input layers.

In some embodiments, the computer system optionally repeats the generating (316), producing (316), and identifying operations (318) to increase the number of geometrically congruent work units (320). For example, these operations may be iterated and/or adaptively performed to increase the number of geometrically congruent work units.

Note that in some embodiments of the process 200 and/or the process 300 there may be additional or fewer operations, the order of the operations may be changed, and two or more operations may be combined into a single operation. For example, in some embodiments the one or more stencils and/or the work units may be compressed prior to storage (such as in a cache).

Figure 4A:
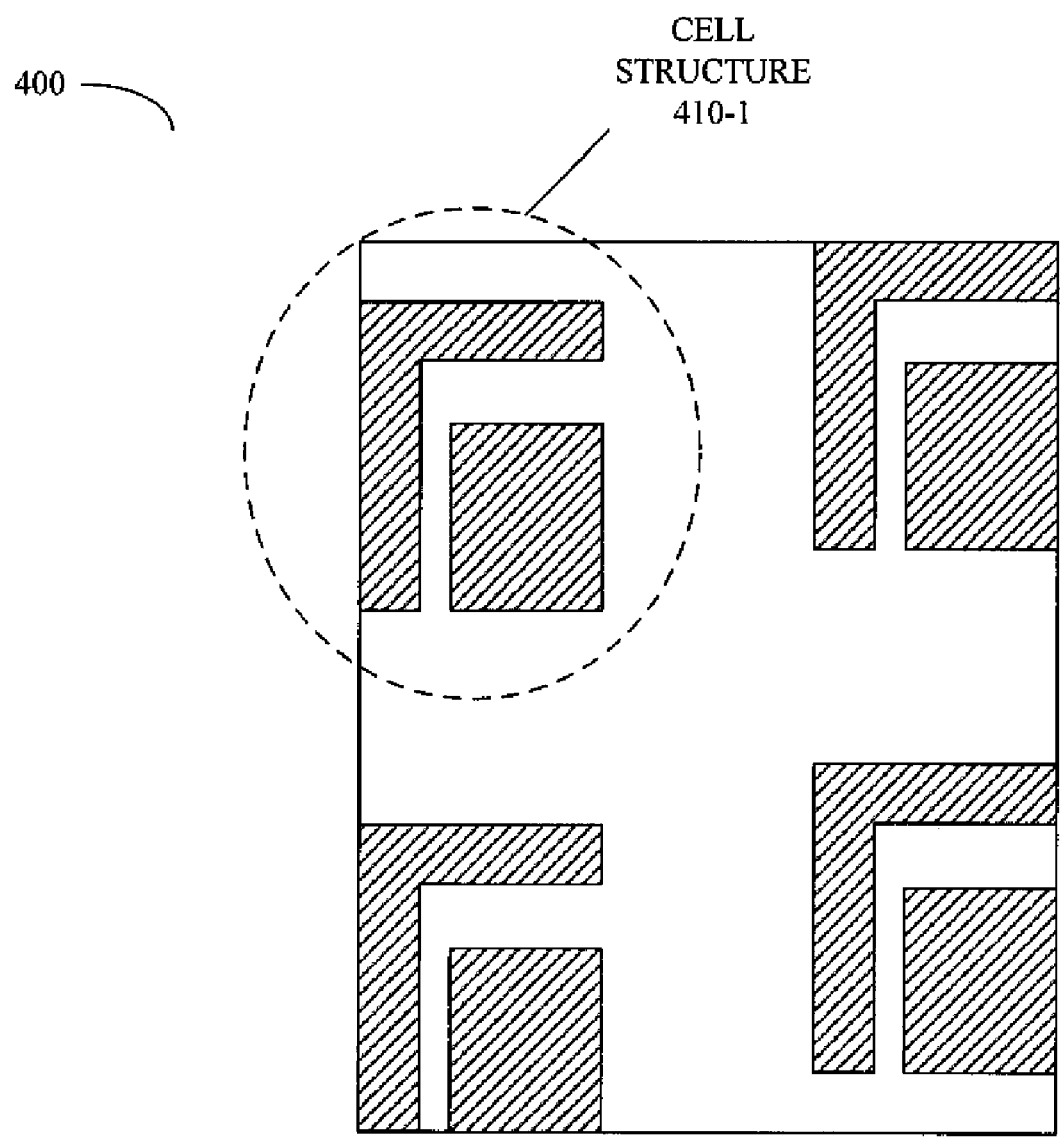
FIG. 4A is a block diagram illustrating partitioning of a design into work units in accordance with an embodiment of the present invention.
Figure 4B:
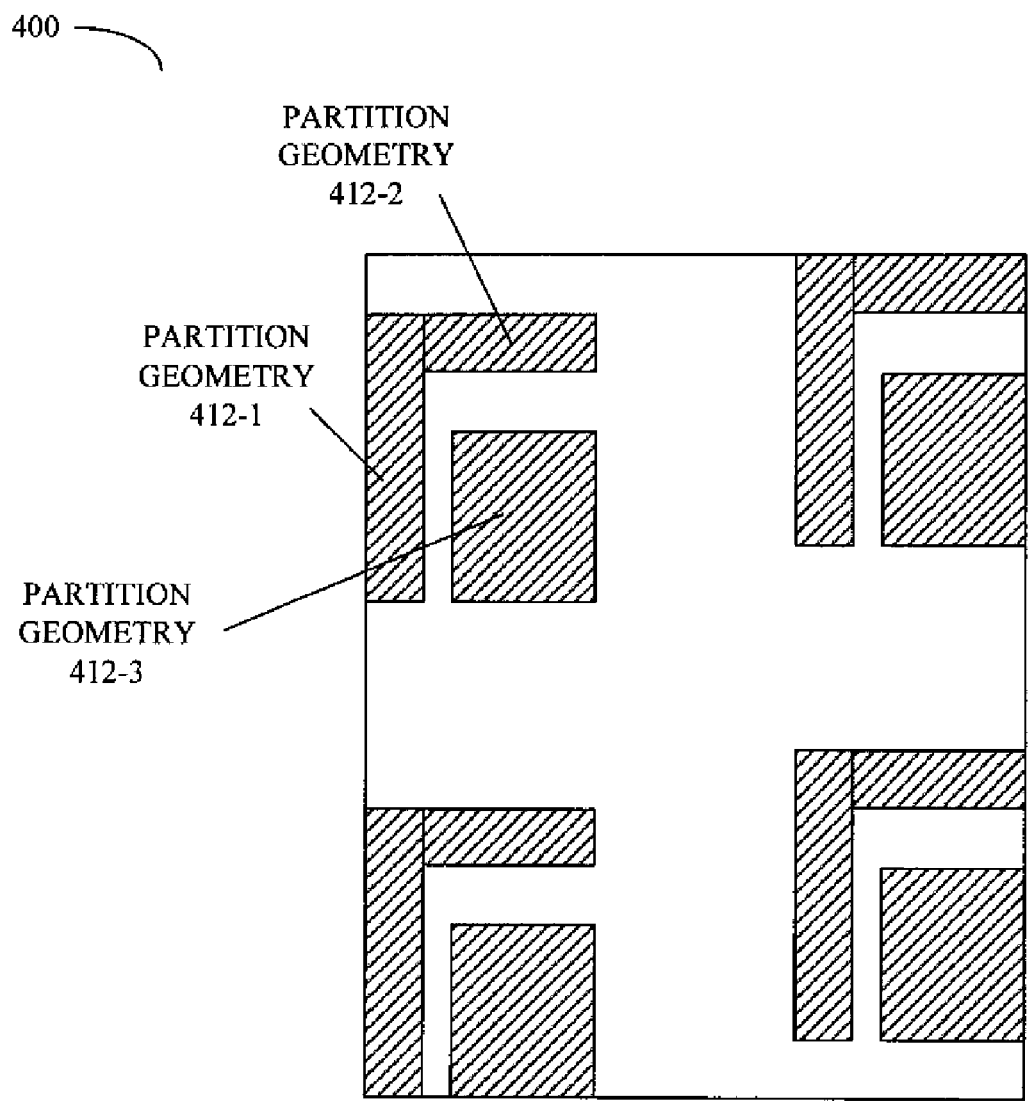
FIG. 4B is a block diagram illustrating partitioning of a design into work units in accordance with an embodiment of the present invention.
Figure 4C:
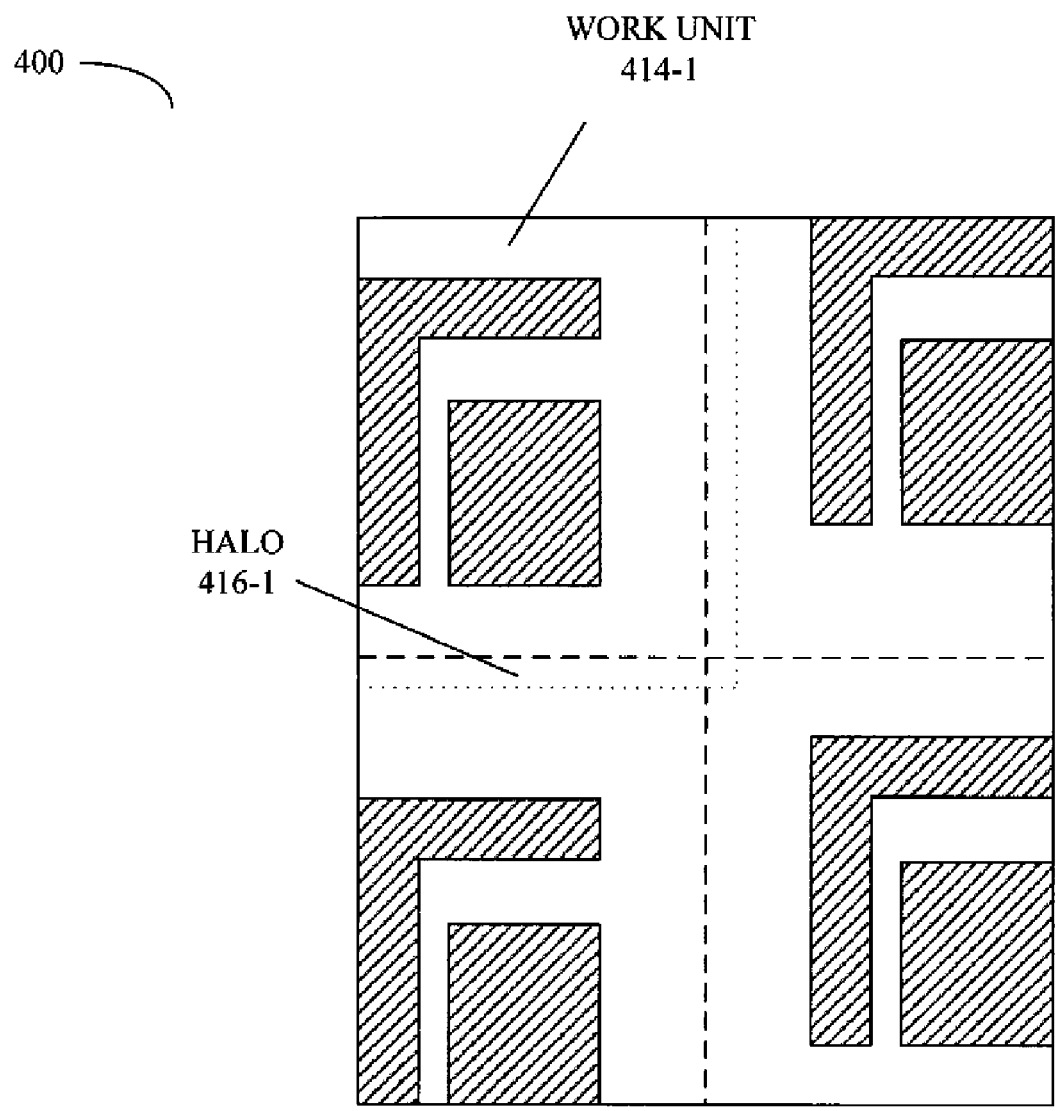
FIG. 4C is a block diagram illustrating partitioning of a design into work units in accordance with an embodiment of the present invention.

We now describe embodiments of partitioning of a design. FIGS. 4A-C present block diagrams illustrating partitioning of a design into work units in accordance with an embodiment 400 of the present invention. In this illustration the cell structures (such as cell structure 410-1) include polygons. These polygons are partitioned into rectangles (as illustrated by partition geometries 412). Note that in this example the L-shaped polygon is divided into partition geometries 412-1 and 412-2. Finally, the design is sub-divided into work units 414, including associated halos 416. Note that in FIG. 4C the shape partitions (partition geometries 412) illustrated in FIG. 4B have been remerged.

Figure 5A:
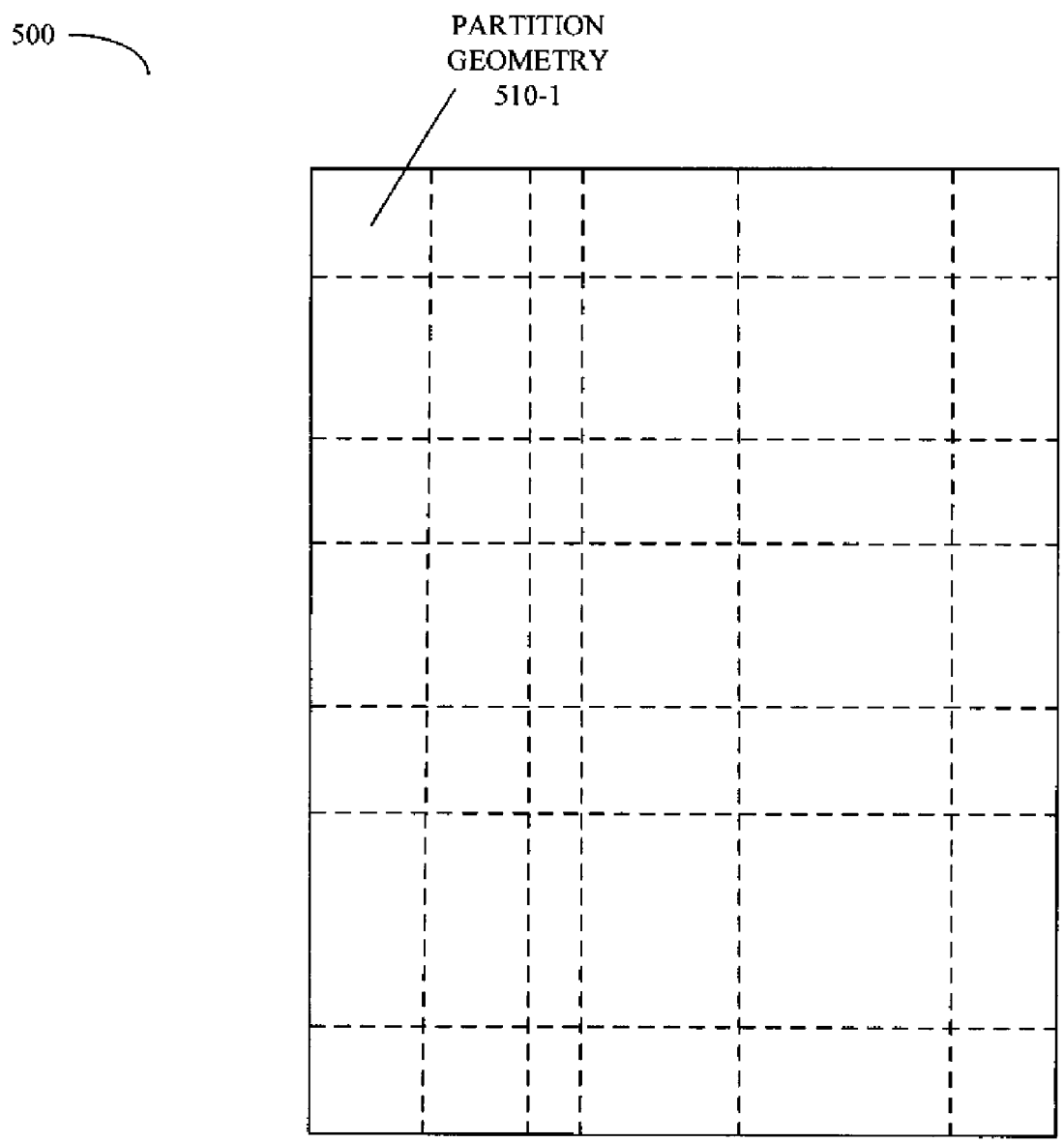
FIG. 5A is a block diagram illustrating partition technique in accordance with an embodiment of the present invention.

A variety of partitioning techniques may be used to generate the work units, including aligned partitioning, uniform partitioning, and/or hybrid partitioning. Aligned partitioning is partitioning that is defined by an arbitrary set of vertical and horizontal 'cut' lines. The only constraint imposed on theses cut lines is that the maximum size of the resulting work units does not exceed a user specified bound. Aligned partitioning technique 500, which divides a design into partition geometries 510 (i.e., work units) is illustrated in the block diagram presented in FIG. 5A. Note that uniform partitioning can be viewed as a special case of aligned partitioning where the distance between two consecutive vertical (or horizontal) lines is the same.

Figure 5B:
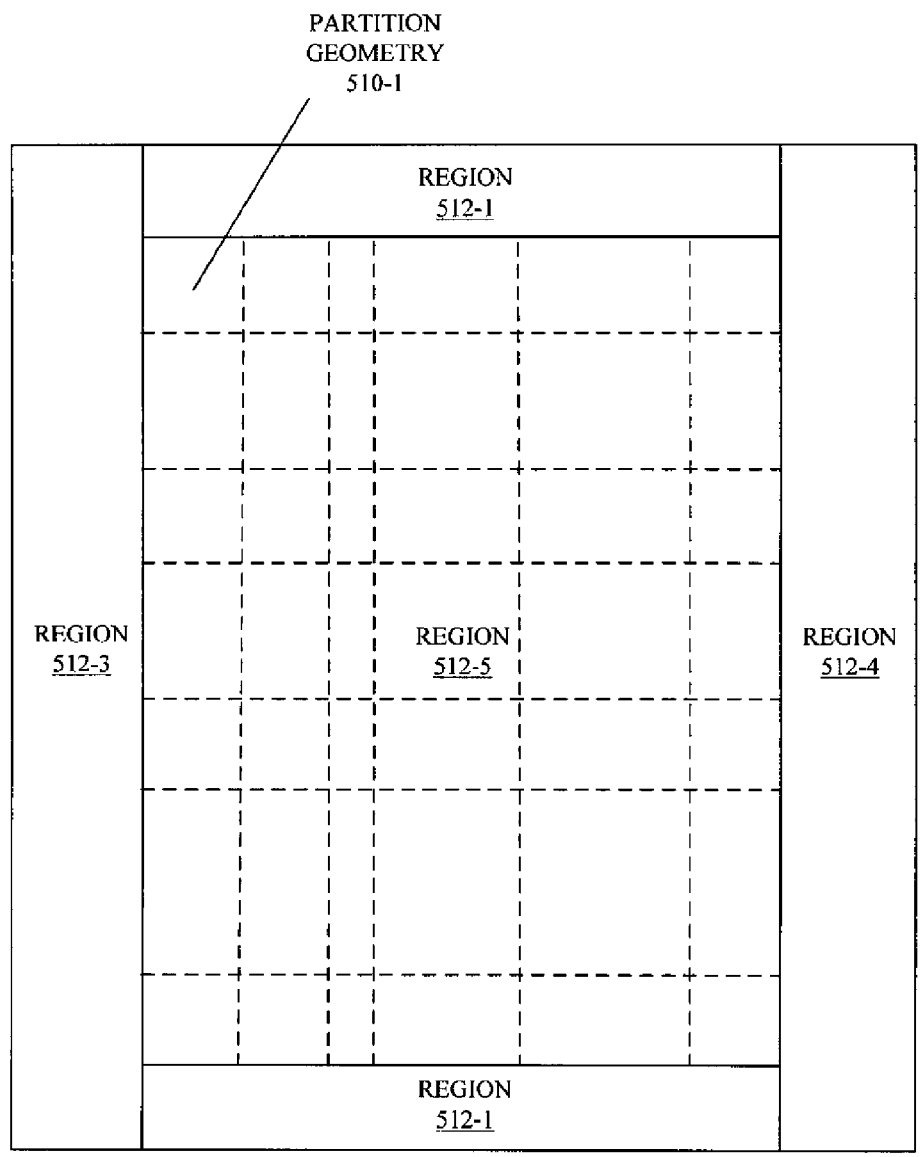
FIG. 5B is a block diagram illustrating partition technique in accordance with an embodiment of the present invention.

Hybrid partitioning operates by dividing the design into a few areas, and then partitioning each area using another partitioning method, such as aligned partitioning. Hybrid partitioning technique 530 is illustrated in the block diagram presented in FIG. 5B. The design is divided into regions 512. Then, region 512-5 is divided into partition geometries 510 (i.e. work units) using aligned partitioning.

In an example embodiment, the analysis or determination of stencils is implemented in Python/C++. Furthermore, the partition generation may be implemented in C++. In some embodiments, all polygons and paths in a design are decomposed into trapezoids. Then, geometric signatures and trapezoid comparisons are used to identify geometrically congruent work-units.

We now describe the results of several illustrative embodiments. Tables 1 and 2 provide summaries of results of partitioning of a target pattern having 5 layers using an aligned and a hybrid partitioning technique, respectively, in accordance with an embodiment of the present invention. While not shown, as expected a higher repetition factor leads to faster run times and lower memory requirements.

TABLE 1

Partitioning results.

| | Work Unit Size ($\mu m^2$) | | |
|---|---|---|---|
| | 16 | 25 | 36 |
| Repetition Factor | 295 | 371 | 909 |
| Number of Instances (M) | 38.08 | 26.88 | 13.90 |
| Number of Work Units | 129,028 | 72,446 | 15,288 |

TABLE 2

Partitioning results.

| | Work Unit Size ($\mu m^2$) | | |
|---|---|---|---|
| | 16 | 25 | 36 |
| Repetition Factor | 172 | 188 | 773 |
| Number of Instances (M) | 34.04 | 18.07 | 10.90 |
| Number of Work Units | 196,987 | 95,786 | 14,096 |

Table 3 provides a summary of results of partitioning of target patterns in a chip design in accordance with an embodiment of the present invention.

TABLE 3

Partitioning results.

| Layer Type | Partitioning Technique | Repetition Factor |
|---|---|---|
| Poly | Aligned | 112.3 |
| Poly | Hybrid | 37.8 |
| Metal 1 | Aligned | 87.9 |

In some embodiments, the partitioning is performed multiple times. The degree of degeneracy for each of the partition geometries or configurations is determined and ranked, and the optimal partition is selected (based at least in part on the degree of degeneracy) and used to facilitate parallel processing.

In some embodiments, the partitioning is based on several factors, including: the degree of degeneracy (i.e., the coverage offered by the partition and/or the number of independent work units), the alignment of the work units, dimensionality reduction, and/or the ability to determine multiple 'minor' patterns in the presence of 'large' patterns. During dimensionality reduction, multiple candidate patterns (such as bit cells, which contain a few shapes) may be used as a hint to guide the partitioning. In particular, a directed acyclic graph or cell graph (i.e., the cell hierarchy) corresponding to at least a portion of a circuit design may be approximated as a tree by reordering nodes in the directed acyclic graph. Then, a recursive technique may be used to select a balanced cut or slice (i.e., the partition) through nodes at a hierarchical level in this tree. These nodes may be used to define a floor plan for a first partitioning operation, which is followed by additional partitioning of the elements defined by this floor plan. Note that the tree facilitates determination of relationships between the nodes or structures in the design and the amount of coverage. Thus, the balanced cut may include nodes corresponding to bit cells (which have a large number of instances) as well as nodes corresponding to smaller (less frequent) patterns.

Furthermore, by determining multiple 'minor' patterns in the presence of 'large' patterns, a partition having a higher degree of redundancy may be achieved. For example, rather than using a work unit corresponding to embodiment 400 (FIG. 4A), which offers limited redundancy, a finer partition (as illustrated by the work units 414 in FIG. 4C) is used, either in conjunction or separately from the work units corresponding to larger patterns. As noted previously, at least some of the work units include multiple shapes (such as trapezoids), where the work units are much larger (up to an order of magnitude larger) than a natural granularity or context of the shapes (such as 4 times a wavelength of a source in a photolithographic process) and the shapes are smaller than this natural granularity.

In an example embodiment, a partition is determined by first identifying multiple 'minor' patterns in the presence of 'large' patterns (as described above). Then, a floor plan and the resulting coverage are determined. Next, in some embodiments a dimensionality reducing operation (such as primary ordering by subdivision) is performed. For example, a two-dimensional pattern may be subdivided based on a unit grid into continuous geometric objects. These continuous objects may be labeled and ordered for subsequent processing. Note that this ordering operation may support linear and/or non-linear rankings of the geometric objects. In this way, the two-dimensional pattern may be converted into a one-dimensional ordered set or sequence.

In other embodiments, the partitioning is performed and then the degree of degeneracy (which is unknown in advance of the partitioning) is determined. For example, separate code or modules may be used to perform the partitioning and to perform the checking (i.e., to determine the degree of degeneracy). Such a self-checking approach may offer improved reliability and/or flexibility. Thus, in some embodiments this approach may be used with other partitioning techniques (such as a heuristic technique or one of several predetermined partitioning techniques) than those described previous.

We now describe embodiments of the calculations or computations performed by the distributed processors. These iterative calculations determine sub-patterns using the work units. In some embodiments, these calculations include an inverse calculation in which a desired or acceptable wafer pattern at an image plane of an optical system is used to determine the write beam (and thus, the write pattern) at an object plane or the projection of the mask pattern at the object plane. For example, the inverse calculations may include an inverse lithography (ILT) calculation. However, in some embodiments the calculation includes an image-based optical proximity correction. Furthermore, in some embodiments the calculations include determining an estimated wafer pattern using a model of the lithographic process. This model may include a photo-resist model.

We now describe embodiments of the inverse calculation that may be used to determine one or more write patterns and/or mask patterns. This inverse calculation may be based on minimization of an error function (which is also sometimes referred to as a cost function or a Hamiltonian function). During each iteration of the calculation, the error function may be a function of the difference between the estimated wafer pattern that results when an image associated with the write pattern or the mask pattern is projected through an optical path in the optical system during a lithographic process. In some embodiments, multiple images may be used, such as those corresponding to a range of process conditions or multiple exposures.

A forward calculation may also be used when determining the error function. In the discussion that follows, coherent illumination by an illumination pattern associated with the source in the lithographic process is assumed. Furthermore, the electric field falling on the photo-mask (which is associated with the mask pattern) or provided by a write device (based on the write pattern) is approximately constant. Using photo-lithography as an example, note that some regions of the photo-mask (such as those corresponding to '0s' in a binary mask pattern) reflect the light to the semiconductor wafer at the image plane of the optical system, while other regions (such as those corresponding to '1s' in the binary mask pattern) do not reflect the light to the semiconductor wafer. It follows that a scalar electric field E after reflection off of the photo-mask (which is henceforth referred to as an image pattern), may be expressed as $$E(\vec{r}) = \begin{Bmatrix} 0 \\ 1 \end{Bmatrix},$$

where $\vec{r} = (x, y)$ is a point on the (x,y) plane. (More generally, the electric field may include grayscale values in the range $\{-1, 1\}$ or arbitrary complex numbers that correspond to the features of the photo-mask. Thus, chrome-on-glass photo-masks and various types of photo-masks other than chrome on glass, such as attenuated phase shifting, strong phase shifting, other materials, etc., are within the scope of the present invention.) Note that this representation of the image pattern may be re-expressed using a function φ (referred to as a level-set function) having positive regions that indicate light reflected to the semiconductor wafer and negative regions that indicate an absence of light reflected to the semiconductor wafer. (More generally, the level-set function may have two or more levels and a given mask pattern or write pattern may be represented by one or more level-set functions.) Furthermore, the level-set function may equal zero at the boundaries or contours of features of the photo-mask. Therefore, the electric field E associated with the photo-mask (and thus, the mask pattern) may be re-expressed as a function of this level-set function, i.e., $$E(\vec{r}) = \hat{h}(\varphi(x,y)),$$

where $\hat{h}$ is the a transmission or reflection function $$\hat{h}(x) = \begin{Bmatrix} 1 & x \geq 0 \\ 0 & x < 0 \end{Bmatrix}.$$

Since an ideal diffraction limited lens acts as a low-pass filter, this may be used as an approximation to the actual (almost but not quite perfect) optics in the optical path in the optical system. Mathematically, the action of a lens may be expressed as $$A(\vec{r}) = f^{-1}(\hat{C}(f(E(\vec{r}))))$$

where $A(\vec{r})$ indicates the electric field distribution on the wafer, f indicates the Fourier transform, $f^{-1}$ indicates the inverse Fourier transform, and $\hat{C}$ indicates the pupil cutoff function, which is zero for frequencies larger than a threshold determined by the numerical aperture of the lens, and one otherwise. Thus, the pupil function is $$\hat{C}(k_x, k_y) = \hat{h}(k_{max}^2 - [k_x^2 + k_y^2]) = \begin{Bmatrix} 0 & k_x^2 + k_y^2 \geq k_{max}^2 \\ 1 & k_x^2 + k_y^2 < k_{max}^2 \end{Bmatrix},$$

wherein $k_x$, $k_y$ and $k_{max}$ represent frequency coordinates in Fourier space. Therefore, the intensity pattern on the semiconductor wafer is simply the square of the electric field $$I(\vec{r}) = |A(\vec{r})|^2.$$

Combining these two equations, we find $$F(\varphi(x,y)) = (|f^{-1}(\hat{C}(f(\hat{h}(\varphi(x,y)))))|^2).$$

This is a self-contained formula for the intensity pattern at the semiconductor wafer.

Note that this is just one embodiment of the forward calculation that can be used within the scope of this invention, chosen by way of example due to its relative simplicity. More sophisticated forward models also fall within the scope of the present invention. Such models may take into account, by way of example but not limitation, various illumination conditions (e.g., off-axis, incoherent), the actual electromagnetics of the light field interacting with the photo-mask, the polarization of the light field, the actual properties of the lens (such as aberrations), and/or the vector nature of the electromagnetic field as it propagates through the optical path in the optical system during the lithographic process.

In some embodiments, during each iteration of the inverse calculation the level-set function corresponding to the mask pattern and/or the write pattern is updated according to $$\varphi_{i+1} = \varphi_i + \Delta \varphi = \varphi_i + \Delta t \cdot \nabla(H),$$

where $\varphi_{i+1}$ is an updated version of the level-set function, $\varphi_i$ is the current version of the level-set function, $\Delta t$ is a step size in the calculation and $\nabla(H)$ is a gradient or a derivative of the error function. Note that $\nabla(H)$ is $$\left.\frac{\delta H}{\delta \phi}\right|_{\phi_i},$$

i.e., it is the Frechet derivative of the error function H. Furthermore, in some embodiments ∇(H) is the direction of steepest descent for minimizing or optimizing H by changing φ. Furthermore, in some embodiments a $1^{st}$ order and/or a $3^{rd}$ order Runge-Kutta method is used when updating $\phi_i$. In other embodiments, a Conjugate Gradient technique, a Levenberg-Marquardt technique, a Quasi-Newton technique, and/or a Simplex technique may be used.

At least some aspects of Simulated Annealing may be utilized in some embodiments of the inverse calculation. In particular, the error function H may be allowed to increase during some iterations as the calculation evolves. In this way, the global minimum in the multi-dimensional space may be determined. Note that the size of this multi-dimensional space is proportional to a number of quantization levels to the power of the number of pixels in the mask pattern or the write pattern. In an example embodiment, these patterns or images have at least 1 million pixels (for example, 1024×1024).

As discussed previously, in some embodiments the inverse calculation is divided into a series of overlapping work units, at least some of which are processed independently and/or concurrently. These work units may be based on features or structures (for example, repetitive structures) in the mask pattern or the write pattern.

In some embodiments, the inverse calculation is run for 100, 1000 or 10,000 iterations at which point the optimal solution has been determined. In other embodiments, the calculation is stopped based on convergence criteria, such as oscillatory behavior, a relative and/or absolute difference between the estimated wafer pattern and the target pattern, the latest change to the error function H, and/or the history of changes to the error function H. For example, the relative difference may be less than 1% and/or the absolute difference may be 10 nm for a critical dimension of 100 nm.

While the preceding discussion illustrates embodiments of calculations performed by distributed processors, such as determining mask patterns, it should be understood that the technique for determining repetitive work units is applicable to a wide variety of techniques related to the local geometric aspects in the design of a mask pattern and/or a photo-mask. For example, the technique for determining repetitive work units may be applied when performing resistance analysis. In some embodiments, width and/or spacing design-rule-checking calculations are performed on the work units. Note that in this case the halo distances would be a function of the distances being measured (as opposed to a function of the wavelength of a source). Furthermore, the technique for determining repetitive work units may be applied when performing Boolean operations on the geometries of the work units. In this case, the halo distances may be zero or epsilon (a small, incremental value). These and other computations that may be performed using distributed processors, may benefit from the reduced computation time, flexibility (such as the ability to perform different types of computations based on the functions of the work units), and time-independent processing capability associated with the technique for determining repetitive work units.

Figure 6:
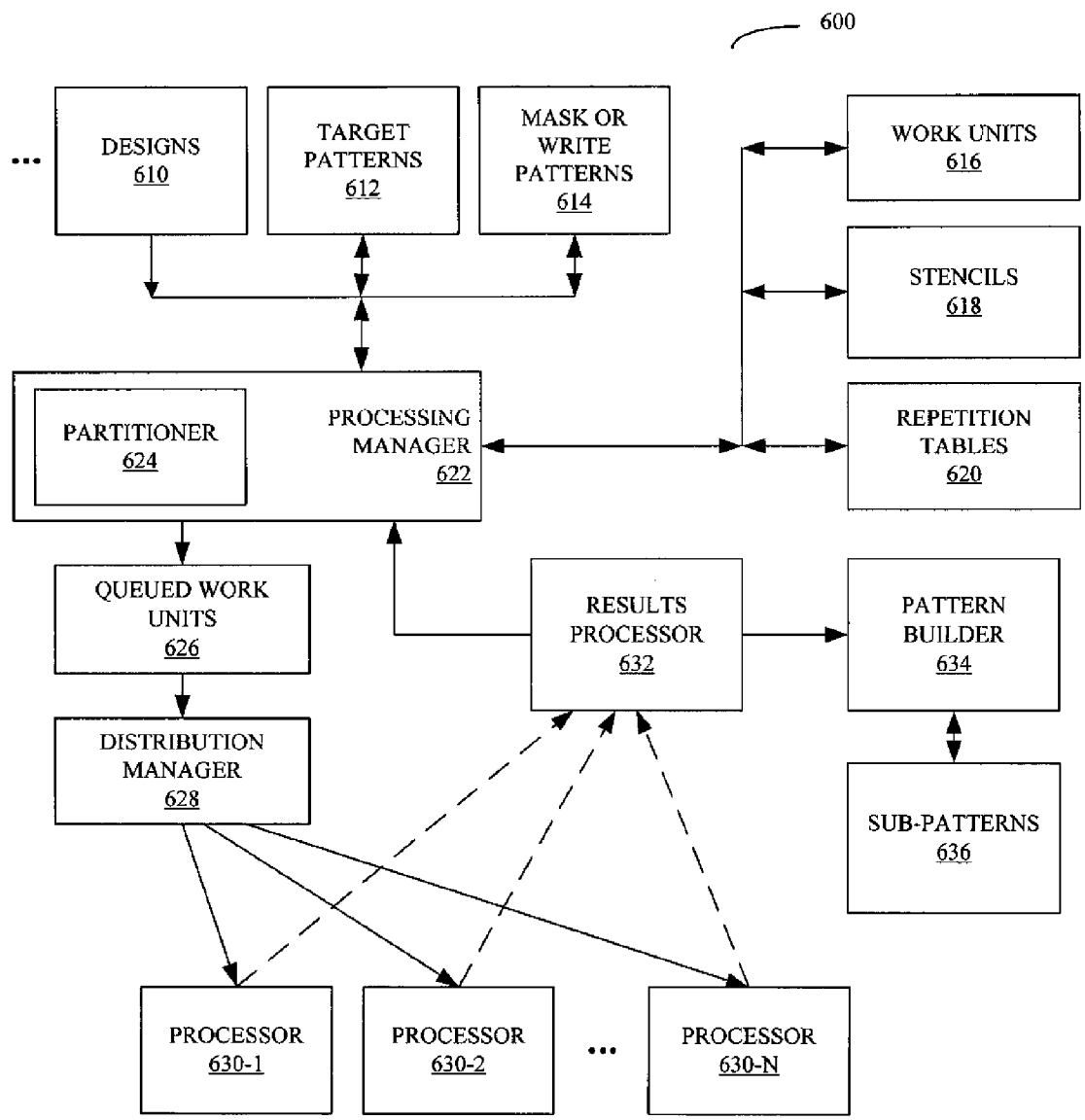
FIG. 6 is a block diagram illustrating a computer system to generating a mask pattern and/or a write pattern in accordance with an embodiment of the present invention.

We now describe embodiments of computer systems that perform the partitioning and the distributed processing. FIG. 6 presents a block diagram illustrating a computer system 600 to generating a mask pattern or a write pattern in accordance with an embodiment of the present invention. It should be appreciated that the layout of the computer system 600 is merely an example and may take on any other suitable layout or configuration. Note that computer system 600 may include multiple computers, servers, and/or data storage devices that may be at one or more locations, including locations that are geographically dispersed from one another and that are linked by a network.

In computer system 600, processing manager 622 takes designs 610 and/or target patterns 612 and determines mask patterns and/or write patterns 614. In some embodiments, processing manager 622 converts designs 610 and/or target patterns 612 from an initial, hierarchical format to a 2-level hierarchy (as was previously described). Furthermore, processing manager 622 may determine one or more stencils 618 from one or more of the designs 610 and/or target patterns 612.

Using the stencils 618, partitioner 624 may divide the designs 610 and/or target patterns 612 into work units 616. In addition, partitioner 624 may determine which of the work units 616 are approximately identical. This information may be stored in repetition tables 620. Note that in some embodiments, partitioner 624 may repeat the determination of the work units 616 multiple times to increase the amount of repetition, and thus, reduce the number of computations needed to determine the mask patterns and/or write patterns 614.

Once the work units 616 are determined, the non-degenerate work units may be queued 626 and provided to distribution manager 628. Then, the non-degenerate work units are distributed to available processors 630. These processors determine sub-patterns from the work units, and forward the calculated sub-patterns to a results processor 632.

Results processor 632 may store sub-patterns 636 in a data structure. Once the sub-patterns are available (i.e., after some or all of the processors 630 have completed their calculations), pattern builder 634 may combine the sub-pattern to produce the mask patterns and/or write patterns 614.

Figure 7:
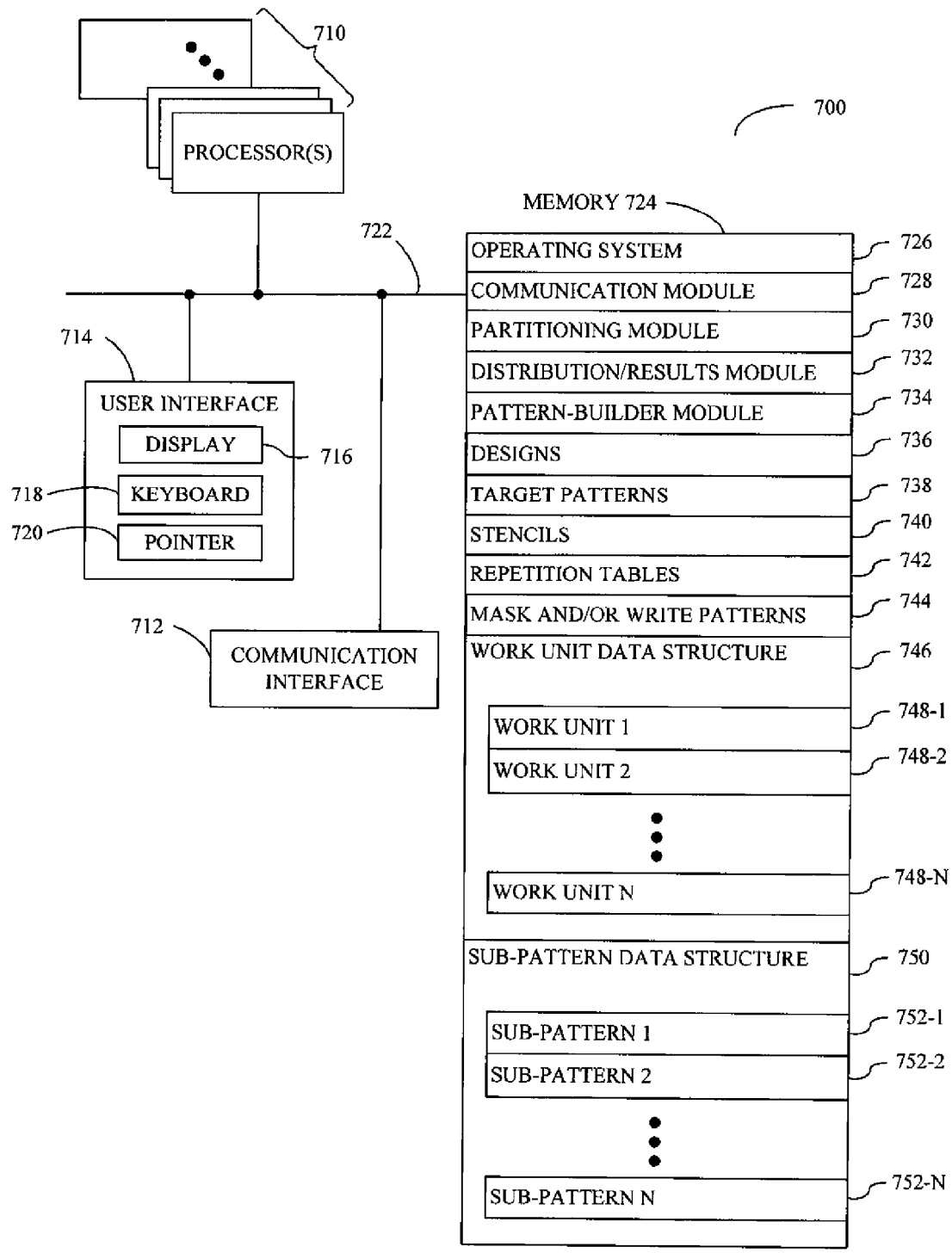
FIG. 7 is a block diagram illustrating a computer system to generating a mask pattern and/or a write pattern in accordance with an embodiment of the present invention.

FIG. 7 presents a block diagram illustrating a computer system 700 to generate a mask pattern and/or a write pattern in accordance with an embodiment of the present invention. Computer system 700 includes multiple processors 710 or processor cores, a communication interface 712, a user interface 714, and one or more signal lines 722 coupling these components together. Note that the processing units 710 support parallel processing and/or multi-threaded operation, the communication interface 712 may have a persistent communication connection, and the one or more signal lines 722 may constitute a communication bus. Moreover, the user interface 714 may include a display 716, a keyboard 718, and/or a pointer 720, such as a mouse.

Memory 724 in the computer system 700 may include volatile memory and/or non-volatile memory. More specifically, memory 724 may include ROM, RAM, EPROM, EEPROM, FLASH, one or more smart cards, one or more magnetic disc storage devices, and/or one or more optical storage devices. Memory 724 may store an operating system 726 that includes procedures (or a set of instructions) for handling various basic system services for performing hardware dependent tasks. The memory 724 may also store communications procedures (or a set of instructions) in a communication module 728. The communication procedures may be used for communicating with one or more computers, devices and/or servers, including computers, devices and/or servers that are remotely located with respect to the computer system 700.

Memory 724 may also include one or more program modules (or a set of instructions), including partitioning module 730 (or a set of instructions), distributing/results module 732 (or a set of instructions), and pattern builder module 734 (or a set of instructions). Furthermore, memory 724 may include: designs 736, target patterns 738, stencils 740, repetition tables 742, and/or mask patterns and/or write patterns 744. And memory 724 may include work unit data structure 746 (including work units 748) and sub-pattern data structure 750 (including sub-patterns 752).

Instructions in the various modules in the memory 724 may be implemented in a high-level procedural language, an object-oriented programming language, and/or in an assembly or machine language. The programming language may be compiled or interpreted, i.e, configurable or configured to be executed by the processing units 710.

Although the computer system 700 is illustrated as having a number of discrete components, FIG. 7 is intended to be a functional description of the various features that may be present in the computer system 700 rather than as a structural schematic of the embodiments described herein. In practice, and as recognized by those of ordinary skill in the art, the functions of the computer system 700 may be distributed over a large number of servers or computers, with various groups of the servers or computers performing particular subsets of the functions. In some embodiments, some or all of the functionality of the computer system 700 may be implemented in one or more ASICs and/or one or more digital signal processors DSPs.

Note that computer system 600 and/or computer system 700 may include fewer components or additional components, two or more components may be combined into a single component, and/or a position of one or more components may be changed. In some embodiments the functionality of computer system 600 and/or computer system 700 may be implemented more in hardware and less in software, or less in hardware and more in software, as is known in the art.

Figure 8:
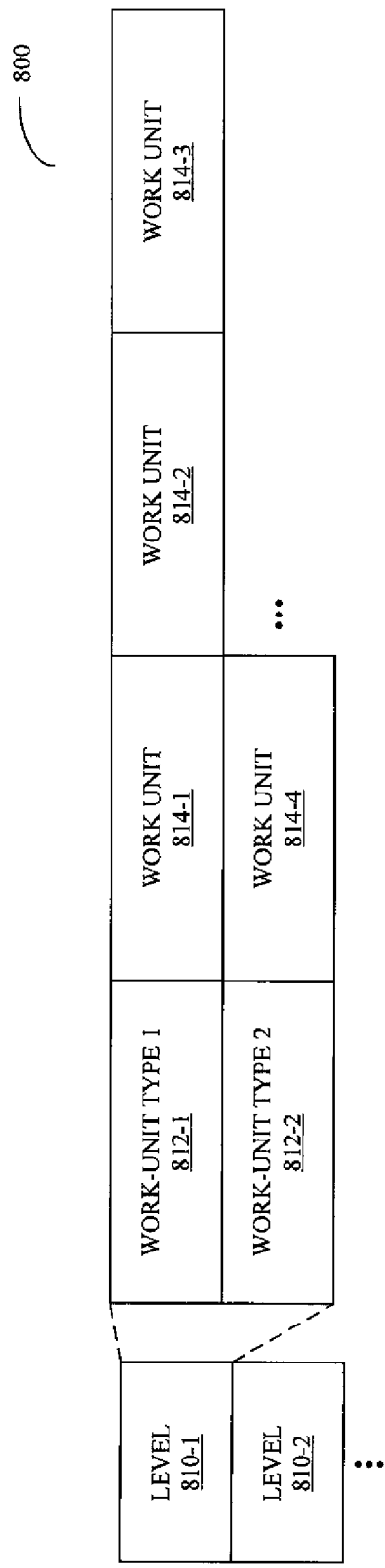
FIG. 8 is a block diagram illustrating a data structure in accordance with an embodiment of the present invention.

We now describe embodiments of a data structure that may be used in the computer system 600 (FIG. 6) and/or the computer system 700 (FIG. 7). FIG. 8 presents a block diagram illustrating a data structure 800 in accordance with an embodiment of the present invention. This data structure may include work units 814 associated with different levels 810 in a design. In particular, the work units 814 may be grouped based on types of work units 812, where work units associated with a given type are approximately identical. Note that that in some embodiments of the data structure 800 there may be fewer or additional components, two or more components may be combined into a single component, and/or a position of one or more components may be changed.

While application of the partitioning technique during determination of a mask pattern has been used as an illustrative example, in other embodiments the partitioning technique may be used during verification, where a mask pattern (or an associated photo-mask) is used in a forward optical model of a lithographic process to determine and compare an estimated wafer pattern with a target pattern. For example, during verification a mask pattern may be partitioned into degenerate and non-degenerate subsets, and the non-degenerate subsets may be distributed to a plurality of processors for processing.

The foregoing descriptions of embodiments of the present invention have been presented for purposes of illustration and description only. They are not intended to be exhaustive or to limit the present invention to the forms disclosed. Accordingly, many modifications and variations will be apparent to practitioners skilled in the art. Additionally, the above disclosure is not intended to limit the present invention. The scope of the present invention is defined by the appended claims.

What is claimed is:

1. A method for generating a mask pattern to be used on a photo-mask in a photolithographic process, comprising:

partitioning a target pattern into subsets of the target pattern, wherein the photo-mask is to print the target pattern during the photolithographic process, wherein the subsets of the target pattern are selected so that at least some of the subsets are approximately identical, thereby dividing the subsets of the target pattern into a degenerate group of subsets of the target pattern and a non-degenerate group of subsets of the target pattern, wherein at least a group of the subsets of the target patterns include multiple shapes, and wherein a given target pattern in at least the group of subsets is significantly larger than a pre-determined length scale and a given shape in the multiple shapes is smaller than the pre-determined length scale;

distributing the non-degenerate group of subsets of the target pattern to a plurality of processors;

using the plurality of processors to determine subsets of the mask pattern in accordance with the non-degenerate group of subsets of the target pattern, wherein a respective subset of the mask pattern corresponds to a respective subset of the target pattern, and wherein at least portions of adjacent subsets of the target pattern partially overlap each other; and combining the subsets of the mask pattern to generate the mask pattern.

2. The method of claim 1, wherein the pre-determined length scale is a multiple of a wavelength of a source in the photo-lithographic process, and wherein the multiple is between 1 and 10.

3. The method of claim 2, wherein the pre-determined length scale includes one or more cell structures in the target pattern.

4. The method of claim 3, wherein the partitioning is independent of boundaries of cells having at least one of the cell structures.

5. The method of claim 3, wherein at least one of the subsets of the target pattern encompasses multiple cells having one or more of the cell structures.

6. The method of claim 3, wherein at least one of the subsets of the target pattern encompasses portions of multiple cells having one or more of the cell structures.

7. The method of claim 3, wherein the subsets of the target pattern are aligned with boundaries of cells having one or more of the cell structures.

8. The method of claim 7, wherein the alignment is adaptively determined during the partitioning.

9. The method of claim 3, wherein the one or more cell structures include one or more bit cells in a memory block.

10. The method of claim 1, wherein the target pattern corresponds to memory.

11. The method of claim 1, wherein the partitioning is in accordance with a size of the target pattern.

12. The method of claim 1, wherein the partitioning is in accordance with a computation capability of the plurality of processors.

13. The method of claim 1, wherein the partitioning is iteratively repeated to increase the size of the degenerate group of subsets of the target pattern and to reduce the size of the non-degenerate group of subsets of the target pattern, thereby decreasing a computation time associated with generating the mask pattern.

14. The method of claim 1, wherein the partitioning is based at least in part on a predicted degree of degeneracy.

15. The method of claim 1, wherein the subsets of the mask pattern are determined using an inverse calculation in which the subsets of the target pattern are at an image plane in a photolithographic process.

16. The method of claim 15, wherein the overlap is less than a pre-determined multiple of a wavelength of a source in the photolithographic process.

17. The method of claim 1, wherein at least some of the processors determine subsets of the mask pattern concurrently.

18. The method of claim 1, wherein at least some of the processors determine subsets of the mask pattern at different times.

19. The method of claim 1, further comprising converting a first format of a target pattern into a second format prior to the partitioning, wherein the first format includes a hierarchical representation of the target pattern and the second format includes a pixel-based representation.

20. The method of claim 19, wherein the first format is compatible with GDSII or OASIS.

21. The method of claim 1, wherein a size of at least some of the subsets of the target pattern is less than 100 $\mu m^2$.

22. The method of claim 1, wherein a size of at least some of the subsets of the target pattern is less than 1000 $\mu m^2$.

23. The method of claim 1, wherein a size of at least some of the subsets of the target pattern is greater than 10000 $nm^2$.

24. The method of claim 1, further comprising verifying the mask pattern, wherein the verifying involves comparing an estimated wafer pattern produced in the photolithographic process using a photo-mask corresponding to the mask pattern with the target pattern, and wherein the verifying involves partitioning the mask pattern into subsets of the mask pattern, and wherein the subsets of the mask pattern are selected so that at least some of the subsets are approximately identical, thereby dividing the subsets of the mask pattern into a degenerate group of subsets of the mask pattern and a non-degenerate group of subsets of the mask pattern.

25. A computer-program product for use in conjunction with a computer system, the computer-program product comprising a non-transitory computer-readable storage medium and a computer-program mechanism embedded therein for generating a mask pattern to be used on a photo-mask in a photolithographic process, the computer-program mechanism including:

instructions for partitioning a target pattern into subsets of the target pattern, wherein the photo-mask is to print the target pattern during the photolithographic process, wherein the subsets of the target pattern are selected so that at least some of the subsets are approximately identical, thereby dividing the subsets of the target pattern into a degenerate group of subsets of the target pattern and a non-degenerate group of subsets of the target pattern, wherein at least a group of the subsets of the target patterns include multiple shapes, and wherein a given target pattern in at least the group of subsets is significantly larger than a pre-determined length scale and a given shape in the multiple shapes is smaller than the pre-determined length scale;

instructions for distributing the non-degenerate group of subsets of the target pattern to a plurality of processors;

instructions for using the plurality of processors to determine subsets of the mask pattern in accordance with the non-degenerate group of subsets of the target pattern, wherein a respective subset of the mask pattern corresponds to a respective subset of the target pattern, and wherein at least portions of adjacent subsets of the target pattern partially overlap each other; and instructions for combining the subsets of the mask pattern to generate the mask pattern.

26. A computer system, comprising:

at least one processor;

at least one memory; and at least one program module, the program module stored in the memory and configured to be executed by the processor, wherein at least the program module is for generating a mask pattern to be used on a photo-mask in a photolithographic process, at least the program module mechanism including:

instructions for partitioning a target pattern into subsets of the target pattern, wherein the photo-mask is to print the target pattern during the photolithographic process, wherein the subsets of the target pattern are selected so that at least some of the subsets are approximately identical, thereby dividing the subsets of the target pattern into a degenerate group of subsets of the target pattern and a non-degenerate group of subsets of the target pattern, wherein at least a group of the subsets of the target patterns include multiple shapes, and wherein a given target pattern in at least the group of subsets is significantly larger than a pre-determined length scale and a given shape in the multiple shapes is smaller than the pre-determined length scale;

instructions for distributing the non-degenerate group of subsets of the target pattern to a plurality of processors;

instructions for using the plurality of processors to determine subsets of the mask pattern in accordance with the non-degenerate group of subsets of the target pattern, wherein a respective subset of the mask pattern corresponds to a respective subset of the target pattern, and wherein at least portions of adjacent subsets of the target pattern partially overlap each other; and instructions for combining the subsets of the mask pattern to generate the mask pattern.

27. A computer system, comprising:

means for computing;

means for storing; and at least one program module mechanism, the program module mechanism stored in at least the means for storing and configured to be executed by at least the means for computing, wherein at least the program module is for generating a mask pattern to be used on a photo-mask in a photolithographic process, at least the program module mechanism including:

instructions for partitioning a target pattern into subsets of the target pattern, wherein the photo-mask is to print the target pattern during the photolithographic process, wherein the subsets of the target pattern are selected so that at least some of the subsets are approximately identical, thereby dividing the subsets of the target pattern into a degenerate group of subsets of the target pattern and a non-degenerate group of subsets of the target pattern, wherein at least a group of the subsets of the target patterns include multiple shapes, and wherein a given target pattern in at least the group of subsets is significantly larger than a pre-determined length scale and a given shape in the multiple shapes is smaller than the pre-determined length scale;

instructions for distributing the non-degenerate group of subsets of the target pattern to a plurality of processors;

instructions for using the plurality of processors to determine subsets of the mask pattern in accordance with the non-degenerate group of subsets of the target pattern, wherein a respective subset of the mask pattern corresponds to a respective subset of the target pattern, and wherein at least portions of adjacent subsets of the target pattern partially overlap each other; and instructions for combining the subsets of the mask pattern to generate the mask pattern.

28. A semiconductor wafer, wherein the semiconductor wafer is produced in a photolithographic process that includes a photo-mask, wherein a mask pattern to which the photo-mask corresponds is determined in a process including the operations of:

partitioning a target pattern into subsets of the target pattern, wherein the photo-mask is to print the target pattern during the photolithographic process, wherein the subsets of the target pattern are selected so that at least some of the subsets are approximately identical, thereby dividing the subsets of the target pattern into a degenerate group of subsets of the target pattern and a non-degenerate group of subsets of the target pattern, wherein at least a group of the subsets of the target patterns include multiple shapes, and wherein a given target pattern in at least the group of subsets is significantly larger than a pre-determined length scale and a given shape in the multiple shapes is smaller than the pre-determined length scale;

distributing the non-degenerate group of subsets of the target pattern to a plurality of processors;

using the plurality of processors to determine subsets of the mask pattern in accordance with the non-degenerate group of subsets of the target pattern, wherein a respective subset of the mask pattern corresponds to a respective subset of the target pattern, and wherein at least portions of adjacent subsets of the target pattern partially overlap each other; and combining the subsets of the mask pattern to generate the mask pattern.

29. A photo-mask for use in a photolithographic process, wherein a mask pattern to which the photo-mask corresponds is determined in a process including the operations of:

partitioning a target pattern into subsets of the target pattern, wherein the photo-mask is to print the target pattern during the photolithographic process, wherein the subsets of the target pattern are selected so that at least some of the subsets are approximately identical, thereby dividing the subsets of the target pattern into a degenerate group of subsets of the target pattern and a non-degenerate group of subsets of the target pattern, wherein at least a group of the subsets of the target patterns include multiple shapes, and wherein a given target pattern in at least the group of subsets is significantly larger than a pre-determined length scale and a given shape in the multiple shapes is smaller than the pre-determined length scale;

distributing the non-degenerate group of subsets of the target pattern to a plurality of processors;

using the plurality of processors to determine subsets of the mask pattern in accordance with the non-degenerate group of subsets of the target pattern, wherein a respective subset of the mask pattern corresponds to a respective subset of the target pattern, and wherein at least portions of adjacent subsets of the target pattern partially overlap each other; and combining the subsets of the mask pattern to generate the mask pattern.

30. A computer-implemented method for partitioning a target pattern to be used in generating a mask pattern to be used on a photo-mask in a photolithographic process, comprising:

using the computer, partitioning a target pattern into subsets of the target pattern, wherein the photo-mask is to print the target pattern during the photolithographic process, wherein at least a group of the subsets of the target patterns include multiple shapes, and wherein a given target pattern in at least the group of subsets is significantly larger than a pre-determined length scale and a given shape in the multiple shapes is smaller than the pre-determined length seal;

and wherein, after the partitioning is completed, at least portions of adjacent subsets of the target pattern partially overlap each other; and determining a degenerate group of subsets of the target pattern and a non-degenerate group of subsets of the target pattern.

31. A computer-implemented method for partitioning a target pattern to be used in generating a write pattern to be used in a mask-less lithography process, comprising:

using the computer, partitioning a target pattern into subsets of the target pattern, wherein the write pattern is to be used to print the target pattern during the mask-less lithographic process, wherein at least a group of the subsets of the target patterns include multiple shapes, wherein a given target pattern in at least the group of subsets is significantly larger than a pre-determined length scale and a given shape in the multiple shapes is smaller than the pre-determined length scale, and wherein, after the partitioning is completed, at least portions of adjacent subsets of the target pattern partially overlap each other; and determining a degenerate group of subsets of the target pattern and a non-degenerate group of subsets of the target pattern.

32. A method for generating a write pattern to be used in a mask-less lithography process, comprising:

partitioning a target pattern into subsets of the target pattern, wherein the write pattern is to be used to print the target pattern during the mask-less lithographic process, wherein the subsets of the target pattern are selected so that at least some of the subsets are approximately identical, thereby dividing the subsets of the target pattern into a degenerate group of subsets of the target pattern and a non-degenerate group of subsets of the target pattern, wherein at least a group of the subsets of the target patterns include multiple shapes, and wherein a given target pattern in at least the group of subsets is significantly larger than a pre-determined length scale and a given shape in the multiple shapes is smaller than the pre-determined length scale;

distributing the non-degenerate group of subsets of the target pattern to a plurality of processors;

using the plurality of processors to determine subsets of the write pattern in accordance with the non-degenerate group of subsets of the target pattern, wherein a respective subset of the write pattern corresponds to a respective subset of the target pattern, and wherein at least portions of adjacent subsets of the target pattern partially overlap each other; and combining the subsets of the write pattern to generate the write pattern.

* * * * *